United States Patent
Okada et al.

(10) Patent No.: US 9,720,014 B2
(45) Date of Patent: Aug. 1, 2017

(54) SEMICONDUCTOR EVALUATION APPARATUS AND SEMICONDUCTOR EVALUATION METHOD

(71) Applicant: Mitsubishi Electric Corporation, Tokyo (JP)

(72) Inventors: Akira Okada, Tokyo (JP); Kosuke Hatozaki, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 287 days.

(21) Appl. No.: 14/742,222

(22) Filed: Jun. 17, 2015

(65) Prior Publication Data

US 2016/0116501 A1   Apr. 28, 2016

(30) Foreign Application Priority Data

Oct. 22, 2014   (JP) .................. 2014-214956

(51) Int. Cl.
G01R 31/28   (2006.01)
G01R 1/04   (2006.01)
G01R 1/067   (2006.01)

(52) U.S. Cl.
CPC ....... G01R 1/0491 (2013.01); G01R 1/06722 (2013.01)

(58) Field of Classification Search
CPC ......... H01L 2924/00; H01L 2924/0002; H01L 21/76849; G01R 31/307; G01R 31/2648; G01R 31/2831; G01R 1/0491; G01R 1/06711

See application file for complete search history.

(56) References Cited

U.S. PATENT DOCUMENTS

| 8,779,792 B2* | 7/2014 | Kim ................... G01R 31/2891 324/756.03 |
| 9,069,008 B2* | 6/2015 | Yasuta ................. G01R 1/0408 |
| 2013/0141132 A1* | 6/2013 | Yasuta ................. G01R 1/0408 324/756.03 |
| 2014/0176173 A1 | 6/2014 | Shinohara et al. |

FOREIGN PATENT DOCUMENTS

| JP | 2013-032938 A | 2/2013 |
| JP | 2013-118320 A | 6/2013 |

* cited by examiner

*Primary Examiner* — Alesa Allgood
(74) *Attorney, Agent, or Firm* — Studebaker & Brackett PC

(57) ABSTRACT

A back surface potential lead-out portion has one end portion disposed in a side of a back surface of a semiconductor wafer held by a semiconductor wafer holding portion and the other end portion disposed in a side of a front surface of the semiconductor wafer held by the semiconductor wafer holding portion. The semiconductor wafer and the semiconductor wafer holding portion that holds the semiconductor wafer are movable in an in-plane direction of the semiconductor wafer. In a case where the semiconductor wafer and the semiconductor wafer holding portion that holds the semiconductor wafer are moved in the in-plane direction, a portion of the back surface potential lead-out portion located in the in-plane direction from the semiconductor wafer is fixed close to the outside of a movement region of the semiconductor wafer.

15 Claims, 8 Drawing Sheets

F I G . 1
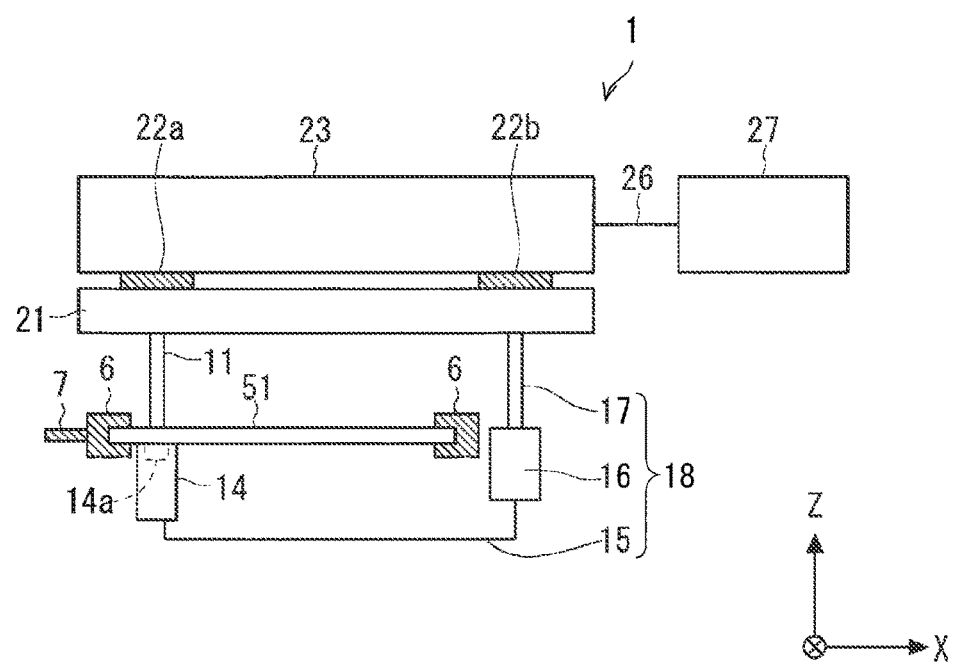

SEMICONDUCTOR EVALUATION APPARATUS AND SEMICONDUCTOR EVALUATION METHOD

BACKGROUND OF THE INVENTION

Field of the Invention

The present invention relates to a semiconductor evaluation apparatus that evaluates a plurality of vertical semiconductor devices provided in a semiconductor wafer and to a semiconductor evaluation method therefor.

Description of the Background Art

A method of bringing a mounting surface of an object to be measured into contact with a chuck stage and fixing the mounting surface thereon by vacuum adsorption is commonly used when electrical characteristics of the object to be measured, such as a semiconductor wafer and a semiconductor chip, are measured (evaluated). In an evaluation apparatus that evaluates semiconductor devices having a vertical structure capable of passing current in out-of-plane directions of the semiconductor wafer, the chuck stage that fixes the mounting surface of the semiconductor wafer is used as one of measurement electrodes. In such evaluation apparatus, a cable connected to the chuck stage is connected to an evaluation unit, and the cable has its length longer by a length for routing. The longer cable causes a greater parasitic inductance in a measurement path, resulting in the problem that accuracy of the evaluation of the vertical semiconductor devices deteriorates.

Meanwhile, in Japanese Patent Application Laid-Open No. 2013-118320, for example, a wafer inspection device has been developed such that a shortening of the measurement path and a reduction in the parasitic inductance can be achieved, the wafer inspection device including a probe contact region in addition to a wafer holding portion. In Japanese Patent Application Laid-Open No. 2013-32938, for example, a device that disposes a contact plate close to an object to be measured has been developed such that resistance in a measurement line can be reduced.

In the conventional technology, however, portions (chuck stage and probe contact region in Japanese Patent Application Laid-Open No. 2013-118320) at high voltage have large areas and they are close to each other, resulting in a problem that securing insulation is more difficult as the voltage applied in an evaluation is increased.

SUMMARY OF THE INVENTION

It is an object of the present invention to provide a technology capable of securing insulation in an evaluation of vertical semiconductor devices.

A semiconductor evaluation apparatus according to the present invention that evaluates a plurality of vertical semiconductor devices provided in a semiconductor wafer. The vertical semiconductor devices each include a front surface electrode and a back surface electrode respectively provided on a front surface and a back surface of the semiconductor wafer. The semiconductor evaluation apparatus includes: a semiconductor wafer holding portion that holds the semiconductor wafer; a front surface probe that is electrically connected to the front surface electrode in a case of being in contact with the front surface electrode on the semiconductor wafer held by the semiconductor wafer holding portion; and a back surface connecting portion that is electrically connected to the back surface electrode in a case of being in contact with the back surface electrode on the semiconductor wafer held by the semiconductor wafer holding portion. The semiconductor evaluation apparatus includes: a back surface potential lead-out portion that has one end portion disposed in a side of the back surface of the semiconductor wafer held by the semiconductor wafer holding portion and electrically connected to the back surface connecting portion and that has the other end portion disposed in a side of the front surface of the semiconductor wafer held by the semiconductor wafer holding portion and electrically connected to the one end portion; and an evaluation unit that passes current through the front surface electrode and the back surface electrode via the front surface probe and the other end portion of the back surface potential lead-out portion, respectively, to evaluate electrical characteristics of the vertical semiconductor devices. The semiconductor wafer and the semiconductor wafer holding portion that holds the semiconductor wafer, or the front surface probe, the back surface connecting portion, and the back surface potential lead-out portion are movable in an in-plane direction of the semiconductor wafer. In a case where the semiconductor wafer and the semiconductor wafer holding portion that holds the semiconductor wafer, or the front surface probe, the back surface connecting portion, and the back surface potential lead-out portion are moved in the in-plane direction, one of the semiconductor wafer and a portion of the back surface potential lead-out portion located in the in-plane direction from the semiconductor wafer is fixed close to the outside of a movement region of the other.

The area at the high potential can be reduced more than that in the conventional technology, thereby easily securing the insulation in the evaluation of the vertical semiconductor devices.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are cross-sectional views showing a schematic configuration of a semiconductor evaluation apparatus according to a first preferred embodiment;

DESCRIPTION OF THE PREFERRED
EMBODIMENTS

First Preferred Embodiment

Figure 2:
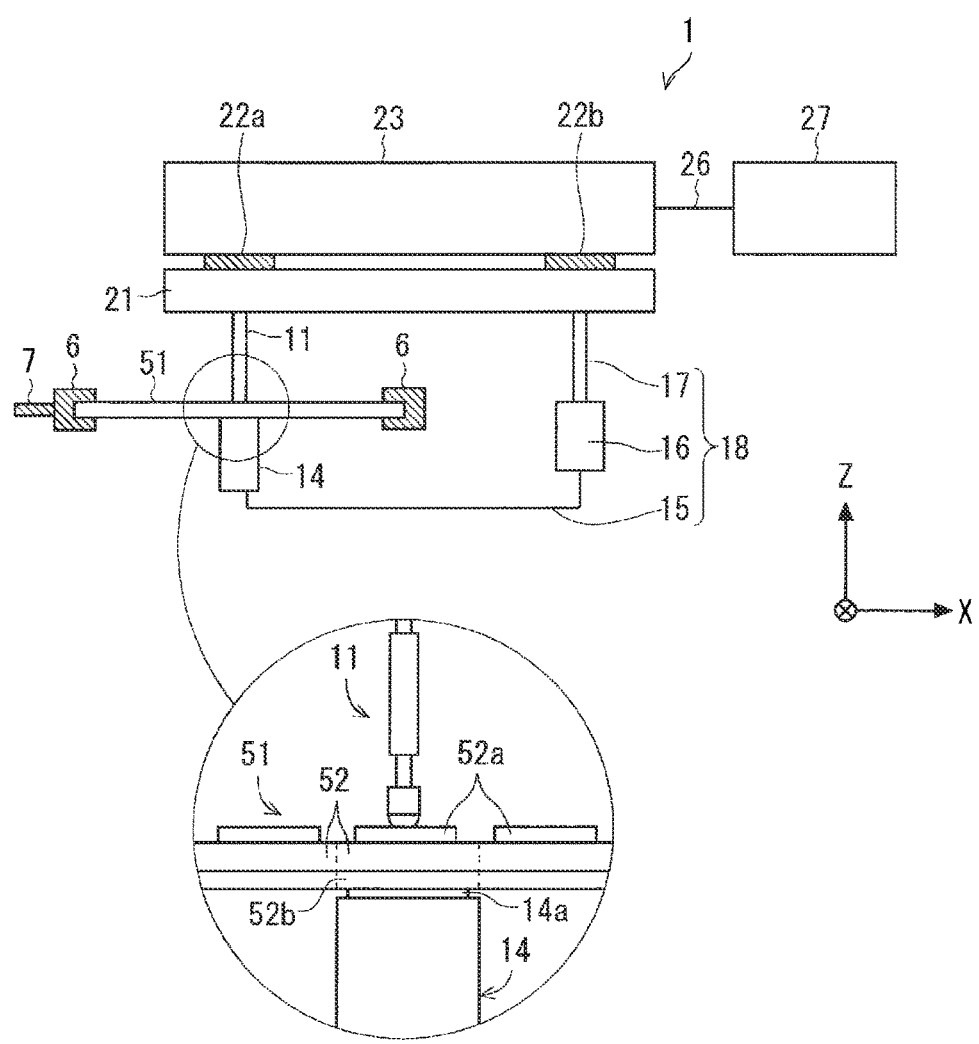

FIGS. 1 and 2 are cross-sectional views showing a schematic configuration of a semiconductor evaluation apparatus 1 according to a first preferred embodiment of the present invention. FIGS. 1 and 2 show different operation states of the semiconductor evaluation apparatus 1. In addition, FIG. 2 also shows an enlarged view of a portion in a circle.

The semiconductor evaluation apparatus 1 is a device that evaluates a plurality of vertical semiconductor devices 52 provided in a semiconductor wafer 51, namely, semiconductor devices such as a transistor and a diode having a vertical structure capable of passing a great current in out-of-plane directions (vertical direction, Z direction). As shown in FIG. 2, the vertical semiconductor devices 52 being subjected to the evaluation include front surface electrodes 52a and a back surface electrode 52b provided on a front surface (+Z side) and a back surface (−Z side) of the semiconductor wafer 51, respectively. In addition, the front surface electrodes 52a are provided separately for each of the plurality of vertical semiconductor devices 52 while the back surface electrode 52b is not typically separated and is integrated in the state of the wafer.

For the sake of convenience, FIG. 2 shows the state where three of the vertical semiconductor devices 52 are provided in the semiconductor wafer 51, but two, four or more of the vertical semiconductor devices 52 may certainly be provided. In addition, for the sake of convenience, the vertical semiconductor devices 52, the front surface electrodes 52a, and the back surface electrode 52b may be omitted to show in diagrams subsequent to FIG. 2.

The semiconductor evaluation apparatus 1 includes a semiconductor wafer holding portion 6, a movable arm 7, a front surface probe 11, a stage 14, a back surface potential lead-out portion 18, a probe substrate 21, probe connecting portions 22a, 22b, a test head 23, a signal line 26, and an evaluation controller 27 that collectively controls these. The back surface potential lead-out portion 18 includes a wiring portion 15, an extension electrode 16, and an extension electrode front surface probe 17.

The semiconductor wafer holding portion 6 holds the semiconductor wafer 51. In the first preferred embodiment, the semiconductor wafer holding portion 6 is in contact with the whole or part of a peripheral portion of the semiconductor wafer 51 to hold the semiconductor wafer 51. In addition, FIG. 1 shows two parts of the semiconductor wafer holding portion 6 separately located at both end portions of the semiconductor wafer 51, but the two parts are connected at least on the near side or the far side.

As shown in FIGS. 1 and 2, the movable arm 7 moves the semiconductor wafer holding portion 6 and the semiconductor wafer 51 held by the semiconductor wafer holding portion 6 mainly in in-plane directions (X, Y directions) of the semiconductor wafer 51. In other words, in the first preferred embodiment, the semiconductor wafer 51 and the semiconductor wafer holding portion 6 that holds the semiconductor wafer 51 is movable in the in-plane directions of the semiconductor wafer 51 with respect to the front surface probe 11, the stage 14 (electrode portion 14a), and the back surface potential lead-out portion 18. While the semiconductor wafer 51 or the like is moved as described above, the vertical semiconductor devices 52 are brought into contact with the front surface probe 11 or the like one at a time for the evaluation.

It should be noted that two or more of the vertical semiconductor devices 52 may be collectively brought into contact with the front surface probe 11 or the like for the evaluation as described below in a modification. Moreover, the plurality of movable arms 7 may hold and move the semiconductor wafer holding portion 6 with stability, instead that the one movable arm 7 holds and moves the semiconductor wafer holding portion 6.

The front surface probe 11 is an electrode for connecting the front surface electrodes 52a and the outside (probe connecting portion 22a) in the evaluation of the vertical semiconductor devices 52. The front surface probe 11 is electrically connected to the front surface electrodes 52a in a case of being in contact with the front surface electrodes 52a on the semiconductor wafer 51 held by the semiconductor wafer holding portion 6. The front surface probe 11 is mechanically connected to the probe substrate 21 while being electrically connected to the probe connecting portion 22a, regardless of the contact with the front surface electrodes 52a. In addition, for the sake of convenience, FIG. 1 shows the only one front surface probe 11, but the plurality of front surface probes 11 may be provided when a relatively great current (of 5 A or more, for example) is energized.

The stage 14 is a small chuck stage that is sufficiently small in comparison with the conventional one on which the whole semiconductor wafer is mounted. For example, if the stage 14 evaluates the vertical semiconductor devices 52 one at a time, the stage 14 corresponds to a size (chip size) of the one vertical semiconductor device 52. The stage 14 as described above can suppress the cost of replacement due to breakage, surface roughness, or the like. Moreover, the stage 14 can reduce a rise in density of current and suppress generation of heat compared to a case where a back surface probe is directly in contact with the back surface electrode 52b of the vertical semiconductor devices 52.

The electrode portion 14a provided on the stage 14 is an electrode for connecting the back surface electrode 52b and the outside (probe connecting portion 22b) in the evaluation of the vertical semiconductor devices 52. The electrode portion 14a is provided on the front surface of the stage 14, the front surface being mechanically and electrically in contact with the back surface of the semiconductor wafer 51. In addition, for the sake of convenience, the electrode portion 14a may be omitted to show in the diagrams subsequent to FIG. 2.

In the first preferred embodiment, the electrode portion 14a having the configuration as described above is used as a back surface connecting portion that is electrically connected to the back surface electrode 52b in a case of being in contact with the back surface electrode 52b on the semiconductor wafer 51 held by the semiconductor wafer holding portion 6. The electrode portion 14a is electrically connected to the extension electrode 16 through the wiring portion 15, regardless of the contact with the back surface electrode 52b.

The main body part of the stage 14 is formed of metal such as nickel, and metal such as copper is applied to a material for the electrode portion 14a. It should be noted that this is not restrictive and the electrode portion 14a may be covered with the other members, such as gold, palladium, tantalum, and platinum, from the viewpoint of improvement in conductivity of the electrode portion 14a, improvement in durability thereof, or the like.

The back surface potential lead-out portion 18 has one end portion disposed in a side of the back surface of the semiconductor wafer 51 held by the semiconductor wafer holding portion 6 and the other end portion disposed in a side of the front surface of the semiconductor wafer 51 held by the semiconductor wafer holding portion 6. In the first preferred embodiment, the wiring portion 15 serves as the one end portion of the back surface potential lead-out portion 18 while the extension electrode front surface probe 17 serves as the other end portion of the back surface potential lead-out portion 18. The one end portion of the back surface potential lead-out portion 18 is electrically connected to the electrode portion 14a of the stage 14 while the other end portion of the back surface potential lead-out portion 18 is electrically connected to the one end portion of the back surface potential lead-out portion 18 through the wiring portion 15 or the like.

Next, the structural components (wiring portion 15, extension electrode 16, and extension electrode front surface probe 17) will each be described.

The wiring portion 15 electrically connects the electrode portion 14a of the stage 14 and the extension electrode 16. A conductive material, such as a cable or a metal plate, is used for the wiring portion 15, and it is herein described assuming that the metal plate being hardly changed in shape and easy to secure a cross-sectional area is used.

The extension electrode 16 serves as a portion of the back surface potential lead-out portion 18 except for the above-mentioned one end portion and is electrically connected to the one end portion. In one example in the first preferred embodiment, the extension electrode 16 is electrically connected to the electrode portion 14a of the stage 14 through the wiring portion 15. The same material for the stage 14, for example, is used as a material for the extension electrode 16.

The extension electrode front surface probe 17 is mechanically connected to the probe substrate 21 while being electrically connected to the probe connecting portion 22b. In addition, for the sake of convenience, FIGS. 1 and 2 show the only one extension electrode front surface probe 17, but the plurality of extension electrode front surface probes 17 may be provided when the relatively great current (of 5 A or more, for example) is energized.

In the first preferred embodiment, the extension electrode 16 and the extension electrode front surface probe 17 are configured to be capable of being in contact with and separated from each other. In a case where the extension electrode 16 and the extension electrode front surface probe 17 are in contact with each other, the electrode portion 14a and the extension electrode front surface probe 17 are electrically connected. In a case where the extension electrode 16 and the extension electrode front surface probe 17 are separated from each other, the electrical connection between the electrode portion 14a and the extension electrode front surface probe 17 is disconnected. In addition, an electrode portion similar to the electrode portion 14a may be provided on the front surface of the extension electrode 16, the front surface being in contact with the extension electrode front surface probe 17.

Also in the first preferred embodiment, in the case where the semiconductor wafer 51 and the semiconductor wafer holding portion 6 that holds the semiconductor wafer 51 move in the in-plane directions of the semiconductor wafer 51 as shown in FIGS. 1 and 2, a portion of the back surface potential lead-out portion 18 located in the in-plane direction from the semiconductor wafer 51 is fixed close to the outside of the movement region of the semiconductor wafer 51. In other words, the back surface potential lead-out portion 18 is fixed in a state where the portion of the back surface potential lead-out portion 18 corresponding to the in-plane direction of the semiconductor wafer 51 is close to the end portion of the movement region of the semiconductor wafer 51. In this configuration, the wiring portion 15 can be formed to be as short as possible, and thus the parasitic inductance can be reduced.

The probe substrate 21 being an insulating substrate fixes the front surface probe 11 and the extension electrode front surface probe 17. The probe substrate 21 is a member for individually and electrically connecting the front surface electrodes 52a of the vertical semiconductor devices 52 and the back surface electrode 52b thereof to the probe connecting portions 22a, 22b through the probes (front surface probe 11 and extension electrode front surface probe 17), respectively.

The probe substrate 21 is prepared according to a type of the semiconductor wafer 51 or the vertical semiconductor devices 52. By replacing the probe substrate 21 with another probe substrate 21, the front surface probe 11 and the extension electrode front surface probe 17 are also replaceable with another front surface probe 11 and another extension electrode front surface probe 17, respectively. In this configuration, the replacement of the probe substrate 21 (probe card) can change a contact position in the vertical semiconductor devices 52 brought into contact with the front surface probe 11. This can make it suitable for various sizes of the semiconductor wafer 51, or various sizes, the number of, or the contact position of the vertical semiconductor devices 52. Furthermore, each probe is easily replaceable at the time of breakage.

The probe connecting portions 22a, 22b, which are connectors, for example, are configured to freely attach and detach the test head 23 to and from the probe substrate 21.

The test head 23, in a case where the probe substrate 21 is attached to the test head 23, is electrically connected to the front surface probe 11 through the probe connecting portion 22a while being electrically connected to the extension electrode front surface probe 17 through the probe connecting portion 22b.

Furthermore, the test head 23 includes a portion that supplies voltage and current to the vertical semiconductor devices 52, a portion that measures the voltage and the current, and a mechanism for selectively switching the use of these. The test head 23 is electrically connected to the evaluation controller 27 downstream of the test head 23 through the signal line 26 and is located close to the vertical semiconductor devices 52 in addition to the evaluation controller 27.

The evaluation controller 27 being the evaluation unit controls the test head 23 to pass current through the front surface electrodes 52a via the front surface probe 11 and pass current through the back surface electrode 52b via the extension electrode front surface probe 17 that serves as the other end portion of the back surface potential lead-out portion 18. The evaluation controller 27 evaluates electrical characteristics of the vertical semiconductor devices 52 by the passage of current.

<Front Surface Probe 11 and Extension Electrode Front Surface Probe 17>

Next, structures of the front surface probe 11 and the extension electrode front surface probe 17 will be described in detail. The structure of the extension electrode front surface probe 17 is almost the same as the structure of the front surface probe 11, so that the structure of the front surface probe 11 will be mainly described.

Figure 3A:
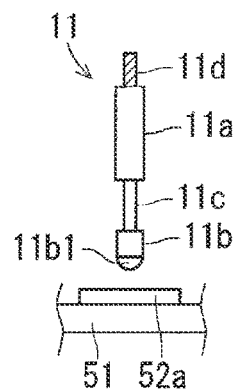
FIGS. 3A, 3B, and 3C are side views for describing about a front surface probe according to the first preferred embodiment.
Figure 3B:
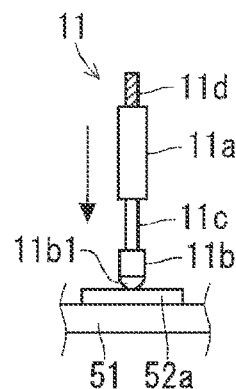
Figure 3C:
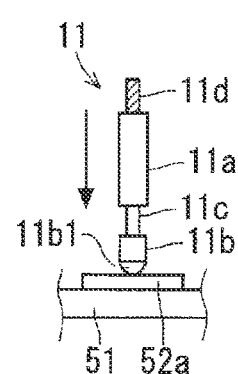

FIGS. 3A, 3B, and 3C are side views showing a schematic configuration and operations of the front surface probe 11 according to the first preferred embodiment. The front surface probe 11 includes a substrate mounting portion 11a, a tip portion 11b, a push portion 11c, and an external connecting portion 11d.

The substrate mounting portion 11a is formed as a base and is mechanically connected to the probe substrate 21. The tip portion 11b has a contact portion 11b1 capable of being mechanically and electrically in contact with the front surface of the front surface electrode 52a of the vertical semiconductor device 52.

A spring member such as a spring installed inside the substrate mounting portion 11a can oscillate the push portion 11c when the contact portion 11b1 comes in contact with the front surface electrode 52a. In other words, the push portion 11c can cause the contact portion 11b1 in contact with the front surface electrode 52a to bias the front surface electrode 52a and can change the distance between the substrate mounting portion 11a and the tip portion 11b. The push portion 11c electrically connects the contact portion 11b1 and the external connecting portion 11d. The external connecting portion 11d that is electrically connected to the contact portion 11b1 functions as an output terminal to the outside (probe connecting portion 22a).

In the first preferred embodiment as described above, the spring probe having the built-in spring is applied to the front surface probe 11. For the operations of the front surface probe 11, the front surface probe 11 is lowered to the lower side (−Z side) in the state where the contact portion 11b1 of the front surface probe 11 is spaced from the front surface electrode 52a as shown in FIG. 3A, and then the contact portion 11b1 comes in contact with the front surface electrode 52a as shown in FIG. 3B. Subsequently, the front surface probe 11 is further lowered, and then the push portion 11c is pushed inside the substrate mounting portion 11a as shown in FIG. 3C. The front surface probe 11 having such configuration can reliably perform the contact between the front surface probe 11 and the front surface electrode 52a of the vertical semiconductor device 52 and thus the electrical connection therebetween.

The extension electrode front surface probe 17 and the front surface probe 11 are the same except for that the front surface electrode 52a and the probe connecting portion 22a are replaced with the extension electrode 16 and the probe connecting portion 22b in the configuration of the front surface probe 11 as described above.

In other words, in the first preferred embodiment, the spring probe having the built-in spring is applied to the extension electrode front surface probe 17. In this configuration, the extension electrode front surface probe 17 can perform the operations shown in FIGS. 3A to 3C, so that the alignment of the extension electrode 16 in the Z direction can be easily performed.

As described above, the front surface probe 11 and the extension electrode front surface probe 17 are the spring-type spring probes having the oscillation in the Z direction, which is not restrictive, and may be cantilever-type contact probes, for example. If the probe having the oscillation in the Z direction is applied to the front surface probe 11 and the extension electrode front surface probe 17, it is not limited to the spring type and it may be a stacked probe or a wire probe, for example.

Metal materials having conductivity such as copper, tungsten, and rhenium tungsten are used for the materials of the front surface probe 11 and the extension electrode front surface probe 17. It should be noted that this is not restrictive, and especially the contact portion 11b1 or the like may be covered with the other members, such as gold, palladium, tantalum, and platinum, from the viewpoint of improvement in conductivity, improvement in durability, or the like.

<Operations>

Next, an operation procedure of the semiconductor evaluation apparatus 1 according to the first preferred embodiment will be described.

Figure 4:
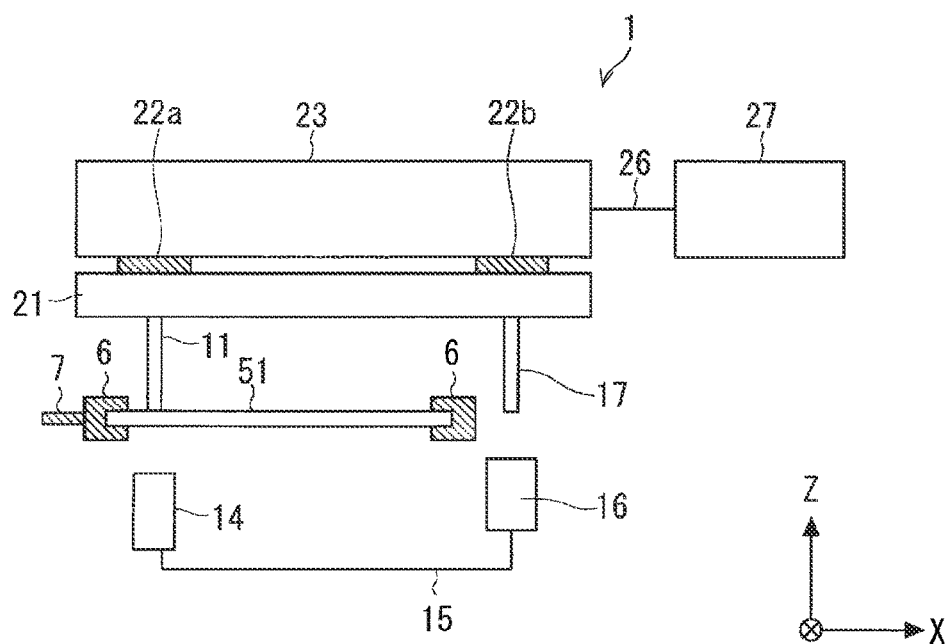
FIG. 4 is a cross-sectional view showing a schematic configuration of the semiconductor evaluation apparatus according to the first preferred embodiment.

First, as shown in FIG. 4, the semiconductor wafer 51 including the plurality of vertical semiconductor devices 52 is placed in the semiconductor wafer holding portion 6, and subsequently, the semiconductor wafer 51 is moved such that the front surface electrode 52a of the one vertical semiconductor device 52 to be evaluated is located immediately below the front surface probe 11, the front substrate electrode 52a being located between the front surface probe 11 and the stage 14.

Subsequently, the front surface probe 11 and the stage 14 approach to the semiconductor wafer 51 from a side of the front surface and from a side of the back surface of the semiconductor wafer 51, respectively. The front surface probe 11 and the electrode portion 14a come in contact with the front surface electrode 52a and the back surface electrode 52b of the one vertical semiconductor device 52 to be evaluated, respectively. Here, the metal plate is used for the wiring portion 15 in the first preferred embodiment, so that the stage 14, the wiring portion 15, and the extension electrode 16 are substantially integrated into one solid matter. In this configuration, as shown in FIG. 1, the electrode portion 14a comes in contact with the back surface electrode 52b, and almost at the same time, the extension electrode 16 comes in contact with the extension electrode front surface probe 17.

Subsequently, the vertical semiconductor device 52 is evaluated on the desired electrical characteristics. After the evaluation is finished, the front surface probe 11 and the stage 14 are separated from the front surface electrode 52a and the back surface electrode 52b, respectively. The metal plate is used for the wiring portion 15 here in the first preferred embodiment, so that the electrode portion 14a is separated from the back surface electrode 52b, and almost at the same time, the extension electrode 16 is separated from the extension electrode front surface probe 17, as shown in FIG. 4.

After the separation as described above, to connect the one vertical semiconductor device 52, which is to be evaluated next, to the front surface probe 11 or the like, the movable arm 7 connected to the semiconductor wafer holding portion 6 is used to move the semiconductor wafer 51 mainly in the in-plane directions. Thus, the vertical semiconductor devices 52 located in the periphery of the semiconductor wafer 51 as shown in FIG. 1 can be evaluated, and also the vertical semiconductor devices 52 located in the center of the semiconductor wafer 51 as shown in FIG. 2 can be evaluated.

Here, in the first preferred embodiment, the front surface electrodes 52a and the back surface electrode 52b have a shape of rotational symmetry in a plan view thereof, and the semiconductor wafer holding portions 6 are configured to be capable of rotating the semiconductor wafer 51 180 degrees in the plan view of the semiconductor wafer 51. Then, the evaluation of the semiconductor wafer 51 starts from the periphery, as shown in FIG. 1. In a case where the evaluation of the center of the semiconductor wafer 51 is performed as shown in FIG. 2, the semiconductor wafer 51 is rotated 180 degrees instead of being evaluated for the rest of it in the same movement direction of the semiconductor wafer 51 that has been performed. Subsequently, the semiconductor 51 is moved back in the direction from FIG. 2 to FIG. 1 for the rest of the evaluation.

In this configuration, the maximum width of the movement region of the semiconductor wafer 51 is approximately 1.5 times as long as the semiconductor wafer 51 and not approximately twice as long as that. Therefore, the necessary space for the evaluation by the semiconductor evaluation apparatus 1 can be reduced.

In addition, in the case where the semiconductor wafer 51 is rotated, the front surface probe 11 and the electrode portion 14a of the stage 14 may be configured to be rotatable 180 degrees in the same direction as (or opposite direction to) the rotation of the semiconductor wafer 51 while keeping their positions. This configuration can obtain the similar effects to those as described above even if the front surface electrodes 52a and the back surface electrode 52b have a shape of rotational asymmetry.

<Conclusion of First Preferred Embodiment>

In the semiconductor evaluation apparatus 1 having the configuration as described above and the semiconductor evaluation method according to the first preferred embodiment, in the case where the semiconductor wafer 51 and the semiconductor wafer holding portion 6 that holds the semiconductor wafer 51 move in the in-plane directions of the semiconductor wafer 51, the portion of the back surface potential lead-out portion 18 located in the in-plane direction from the semiconductor wafer 51 is fixed close to the outside of the movement region of the semiconductor wafer 51.

In this configuration, the area (range) at the high potential can be reduced more than that in the conventional technology, thereby easily securing the insulation. Thus, the improvement in reliability of the evaluation, the improvement in accuracy of the evaluation, the reduced cost, and the shortening of steps are expected. Moreover, the shortening of wiring (wiring portion 15, for example) related to the probe in contact with the semiconductor wafer 51 and thus the reduction in the parasitic inductance are expected. Furthermore, with the shortening of the wiring portion 15 or the like, miniaturization of the semiconductor evaluation apparatus 1 is also expected.

In the first preferred embodiment, the wiring portion 15 is formed of the metal plate. In this configuration, the cross-sectional area of the wiring portion 15 is easily secured, so that high temperatures due to the generation of heat in application of the relatively great current can be suppressed.

<Modifications of First Preferred Embodiment>

Next, first to ninth modifications of the first preferred embodiment will be described. In addition, the first to the ninth modifications described herein can also be applied to a second preferred embodiment described below.

<First Modification>

In the first preferred embodiment, the semiconductor wafer 51 and the semiconductor wafer holding portion 6 that holds the semiconductor wafer 51 are movable in the in-plane directions (X, Y directions) of the semiconductor wafer 51 with respect to the front surface probe 11, the stage 14 (electrode portion 14a), and the back surface potential lead-out portion 18. However, this is not restrictive, and the configuration including the front surface probe 11, the stage 14 (electrode portion 14a), and the back surface potential lead-out portion 18, for example, is provided with a movable mechanism and may thus be movable in the in-plane directions (X, Y directions) of the semiconductor wafer 51 with respect to the semiconductor wafer 51 and the semiconductor wafer holding portion 6 that holds the semiconductor wafer 51.

In the case where the front surface probe 11, the stage 14 (electrode portion 14a), and the back surface potential lead-out portion 18 move in the in-plane directions of the semiconductor wafer 51, the semiconductor wafer 51 may be fixed close to the outside of the movement region of the portion of the back surface potential lead-out portion 18 located in the in-plane direction from the semiconductor wafer 51. The configuration according to the first modification as described above can obtain the effects similar to those in the first preferred embodiment.

<Second Modification>

In the first preferred embodiment, the semiconductor evaluation apparatus 1 includes the one probe substrate 21 that mechanically fixes both of the front surface probe 11 and the extension electrode front surface probe 17.

Figure 5:
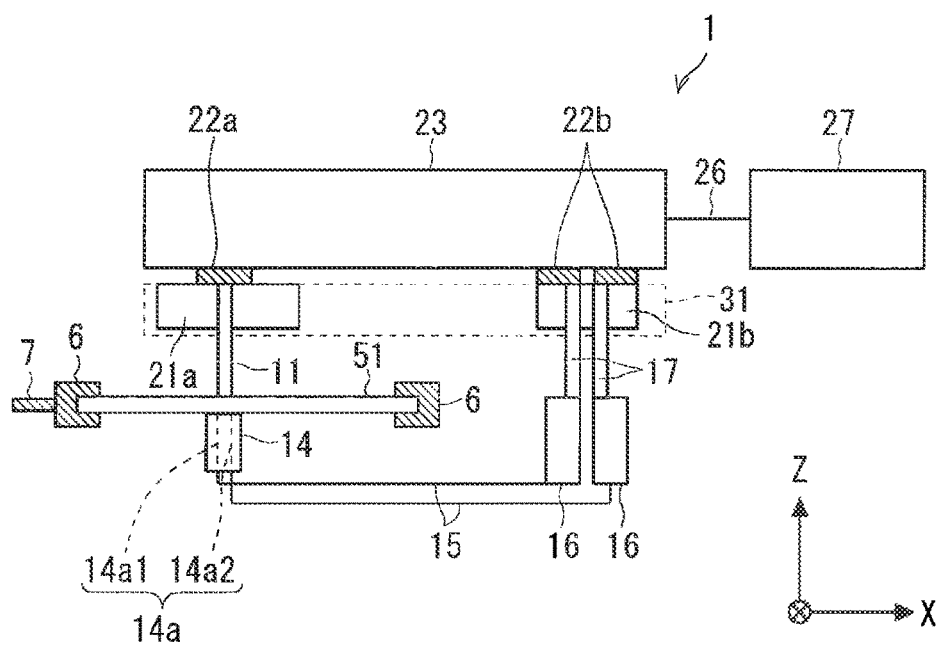
FIG. 5 is a cross-sectional view showing a schematic configuration of a semiconductor evaluation apparatus according to a second modification.

In contrast, as shown in FIG. 5, a semiconductor evaluation apparatus 1 according to a second modification includes a first probe substrate 21a (first insulating substrate) that fixes a front surface probe 11 and a second probe substrate 21b (second insulating substrate) that fixes extension electrode front surface probes 17. Moreover, the semiconductor device 1 according to the second modification includes a frame 31 that holds the first and second probe substrates 21a, 21b.

A test head 23 according to the second modification, in a case where the first probe substrate 21a is attached to the test head 23, is electrically connected to the front surface probe 11 through the probe connecting portion 22a while the test head 23, in a case where the second probe substrate 21b is attached to the test head 23, is electrically connected to the extension electrode front surface probes 17 through the probe connecting portion 22b. By replacing the first probe substrate 21a with another first probe substrate 21a, the front surface probe 11 is also replaceable with another front surface probe 11.

The semiconductor evaluation apparatus 1 according to the second modification as described above can be made suitable for various semiconductor wafers 51 and various vertical semiconductor devices 52 by the replacement of the first probe substrate 21a while the extension electrode front surface probes 17 and the second probe substrate 21b are basically fixed on the test head 23. Therefore, the replacement can be easily performed, and thus a reduced cost is expected.

<Third Modification>

Figure 6:
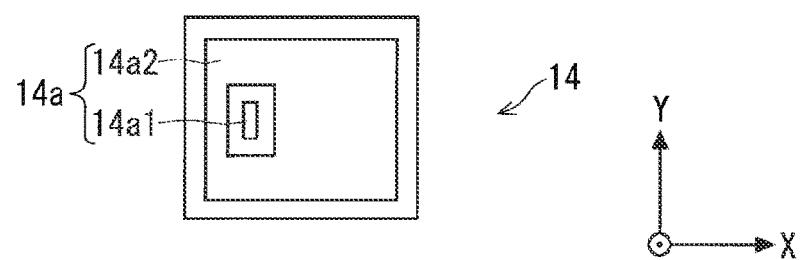
FIG. 6 is a plan view showing a schematic configuration of an electrode portion provided on a stage according to a third modification.

FIG. 6 is a plan view showing a schematic configuration of an electrode portion 14a provided on a stage 14 according to a third modification. Hereinafter, a semiconductor evaluation apparatus 1 according to the third modification will be described with reference to FIG. 5 used in the second modification and FIG. 6. In addition, the third modification does not need to include the first and second probe substrates 21a, 21b.

As shown in FIG. 6, the one electrode portion 14a includes a collector sense electrode 14a1 (sense electrode) for measuring voltage applied to a vertical semiconductor device 52 and a collector force electrode 14a2 (force electrode) for supplying current and voltage to the vertical semiconductor device 52. In other words, the one electrode portion 14a is divided into the collector sense electrode 14a1 and the collector force electrode 14a2.

The collector sense electrode 14a1 and the collector force electrode 14a2 are electrically insulated from each other, and the collector sense electrode 14a1 and the collector force electrode 14a2 can be simultaneously in contact with a back surface electrode 52b of the vertical semiconductor device 52, the back surface electrode 52b corresponding to the collector sense electrode 14a1 and the collector force electrode 14a2.

The semiconductor evaluation apparatus 1 according to the third modification including the collector sense electrode 14a1 and the collector force electrode 14a2 as described above can improve the accuracy of the evaluation.

In FIG. 5, two extension electrodes 16 and two extension electrode front surface probes 17 are provided correspondingly to the collector sense electrode 14a1 and the collector force electrode 14a2. However, this is not restrictive, and the extension electrode 16 may be the two extension electrodes 16 in FIG. 5 combined into one while maintaining the insulation between the two, and the extension electrode front surface probe 17 may be the two extension electrode front surface probes 17 in FIG. 5 combined into one while maintaining the insulation between the two.

<Fourth Modification>

Figure 7:
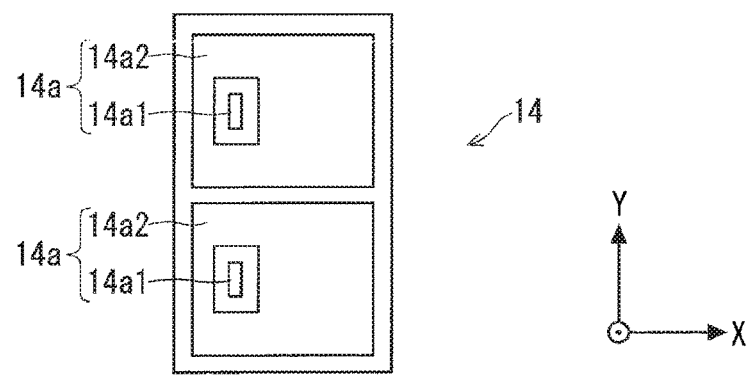
FIG. 7 is a plan view showing a schematic configuration of electrode portions provided on a stage according to a fourth modification.

FIG. 7 is a plan view showing a schematic configuration of electrode portions 14a provided on a stage 14 according to a fourth modification. In addition, in the fourth modification, each electrode portion 14a does not need to include a collector sense electrode 14a1 and a collector force electrode 14a2.

As shown in FIG. 7, the plurality of (herein, two) electrode portions 14a are provided on the stage 14. The two electrode portions 14a can be simultaneously in contact with two vertical semiconductor devices 52. Although the diagram is not shown, front surface probes 11 can be simultaneously in contact with the two vertical semiconductor devices 52 in a similar way. Then, an evaluation controller 27 can evaluate electrical characteristics of the two vertical semiconductor devices 52 at the same time, the two vertical semiconductor devices 52 being in contact with the front surface probes 11 and the two electrode portions 14a.

The semiconductor evaluation apparatus 1 according to the fourth preferred embodiment as described above can be collectively in contact with the plurality of vertical semiconductor devices 52 for the evaluation, and thus the evaluation steps can be shortened.

In addition, the number of electrode portions 14a is two in FIG. 7, which is not restrictive, and may be three or more.

<Fifth Modification>

Figure 8:
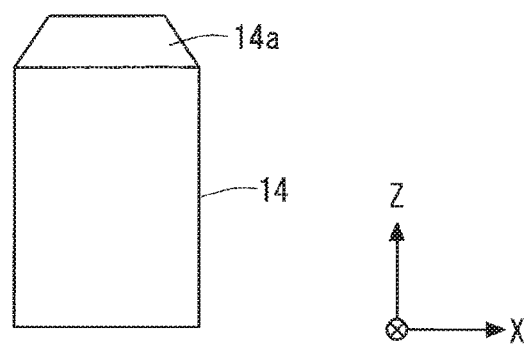
FIG. 8 is a side view showing a schematic configuration of a stage according to a fifth modification.

FIG. 8 is a side view showing a schematic configuration of a stage 14 according to a fifth modification. In the fifth modification similar to the first preferred embodiment, an electrode portion 14a is provided on the stage 14. However, in the fifth modification, the electrode portion 14a is replaceable with another electrode portion 14a.

In a semiconductor evaluation apparatus 1 according to the fifth modification as described above, by replacing the electrode portion 14a according to a size of a vertical semiconductor device 52 or a size of a back surface electrode 52b, the electrode portion 14a in the appropriate size can be used. Moreover, the replacement of the electrode portion 14a is easier than the replacement of the stage 14 itself, and thus a reduced cost is expected.

FIG. 8 shows the state in which the electrode portion 14a having a small area is mounted on the stage 14, but the electrode portion 14a having a large area may certainly be mounted on the stage 14. The connection between the electrode portion 14a and the stage 14 is assumed to be a connection by fitting in each other or a connection with screws, but this is not restrictive. In addition, at least one of the electrode portion 14a and the stage 14 is formed to have a recessed portion in which an alignment pin is fit, thereby facilitating the alignment at the time of replacement.

<Sixth Modification>

Figure 9:
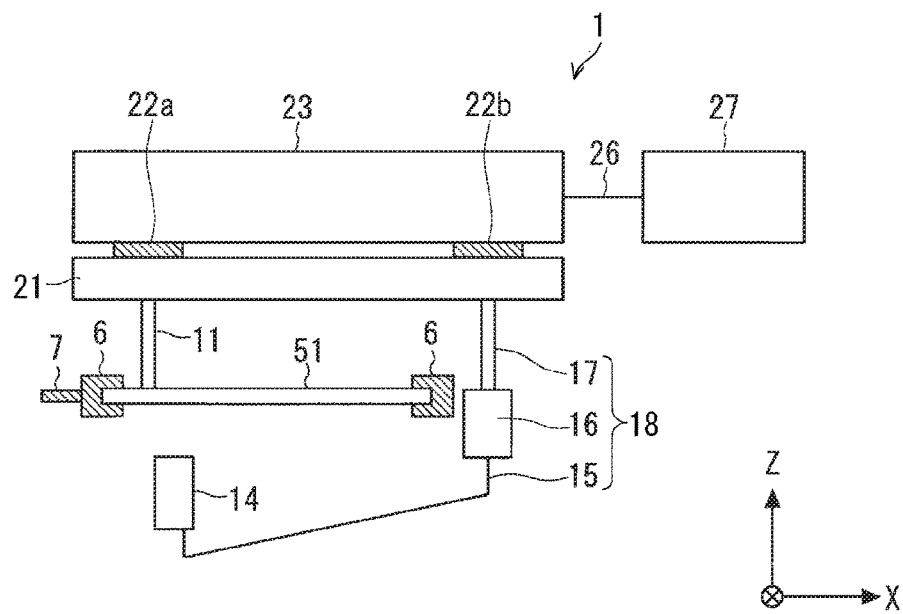
FIG. 9 is a cross-sectional view showing a schematic configuration of a semiconductor evaluation apparatus according to a sixth modification.

In the first preferred embodiment, the wiring portion 15 is formed of the metal plate. In contrast, in a sixth modification as shown in FIG. 9, a wiring portion 15 is formed of a cable whose shape is variable. In other words, in the sixth modification, a stage 14, the wiring portion 15, and an extension electrode 16 are not integrated into one solid matter.

The semiconductor evaluation apparatus 1 according to the sixth modification as described above can bring the stage 14 (electrode portion 14a) into contact with or separate the stage 14 from a semiconductor wafer 51 in a state where the extension electrode 16 and an extension electrode front surface probe 17 are in contact with each other. This can reduce the number of times that the extension electrode 16 comes in contact with and is separated from the extension electrode front surface probe 17, thereby saving time for alignment in the Z direction due to the operation of bringing the extension electrode 16 and the extension electrode front surface probe 17 into contact with each other again. Furthermore, a shortening of the evaluation steps is expected.

<Seventh Modification>

In the first preferred embodiment, the semiconductor wafer holding portion 6 is in contact with the peripheral portion of the semiconductor wafer 51 to hold the semiconductor wafer 51. The back surface connecting portion described above includes the electrode portion 14a of the stage 14.

However, the thickness of the semiconductor wafer 51 in which the vertical semiconductor devices 52 are formed has been further reduced (to 100 µm or less, for example) in recent times. For this reason, the configuration that holds only the peripheral portion of the semiconductor wafer 51 easily causes a bend in the semiconductor wafer 51, possibly leading to breakage at the time of contact with a probe or a stage. A semiconductor evaluation apparatus 1 according to a seventh modification can solve the problems.

Figure 10:
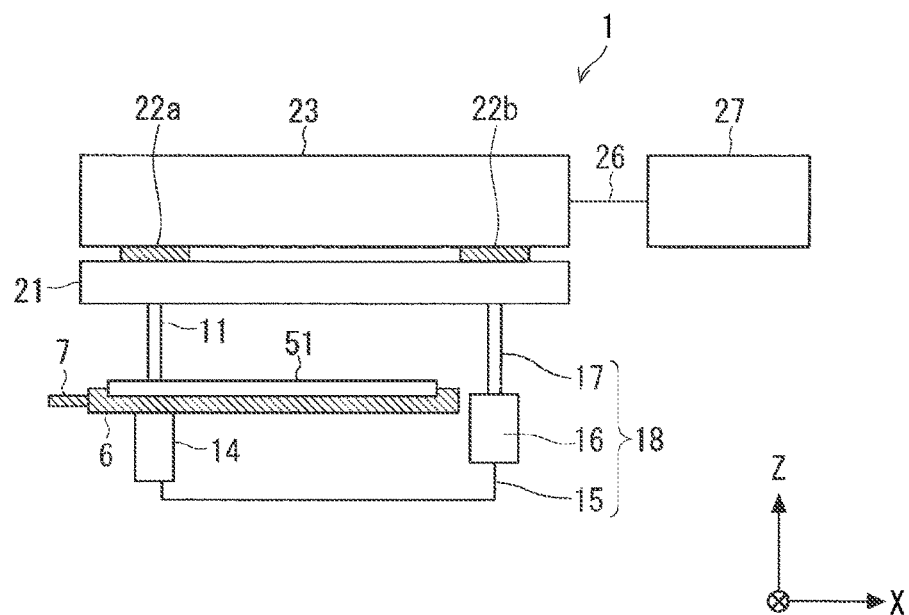
FIG. 10 is a cross-sectional view showing a schematic configuration of a semiconductor evaluation apparatus according to a seventh modification.

FIG. 10 is a cross-sectional view showing a schematic configuration of the semiconductor evaluation apparatus 1 according to the seventh modification. In the seventh modification, a semiconductor wafer holding portion 6 has a tray shape and holds a back surface of a semiconductor wafer 51. The semiconductor wafer holding portion 6 is formed of metal (for example, copper) having conductivity and is in contact with the back surface of the semiconductor wafer 51 so as to be electrically connectable to the back surface of the semiconductor wafer 51. A back surface connecting portion is formed of the semiconductor wafer holding portion 6 instead of the electrode portion 14a.

The semiconductor evaluation apparatus 1 according to the seventh modification having the configuration as described above can suppress the breakage of the semiconductor wafer 51 that has been further reduced in thickness.

The problem of voltage drop can also be reduced if the semiconductor wafer holding portion 6 is configured to be thin in addition to having mechanical strength. Although the diagram is not shown, a mechanism for vacuum adsorption may be applied to the semiconductor wafer holding portion 6 having the tray shape to increase adherence between the semiconductor wafer 51 and the semiconductor wafer holding portion 6.

<Eighth Modification>

In the configuration of the first preferred embodiment and the configurations that have been described, the probe connecting portion 22a extending in the Z direction is provided immediately above the front surface probe 11 to electrically connect the front surface probe 11 and the test head 23 in the shortest distance. Additionally, the evaluated vertical semiconductor device 52 is in contact with the stage 14 immediately below the vertical semiconductor device 52.

Figure 11:
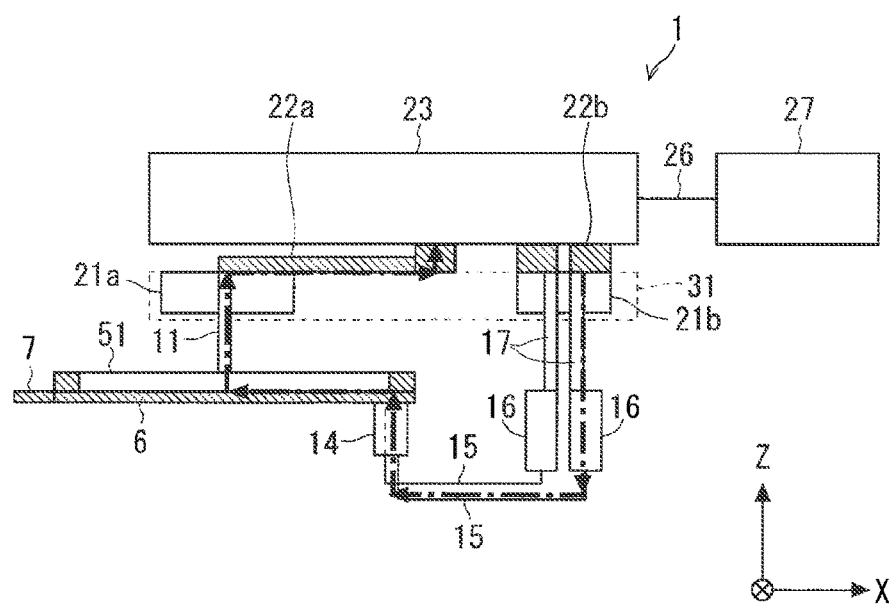
FIG. 11 is a cross-sectional view showing a schematic configuration of a semiconductor evaluation apparatus according to an eighth modification.

In contrast, in an eighth modification as shown in FIG. 11, a probe connecting portion 22a also extends in horizontal directions (X, Y directions). A position in the horizontal directions, in which a portion of the probe connecting portion 22a is connected to a test head 23 (hereinafter referred to as a "head connecting portion"), does not coincide with a position in the horizontal directions, in which the evaluated vertical semiconductor device 52 is located. Moreover, a stage 14 can be electrically connected to the evaluated vertical semiconductor device 52 through a portion extending in the horizontal directions, of a semiconductor wafer holding portion 6, and thus the position of the head connecting portion in the horizontal directions is close to the position of the stage 14 in the horizontal directions.

In a semiconductor evaluation apparatus 1 according to the eighth modification having the configuration as described above, a direction of a conduction path of the probe connecting portion 22a (member) that electrically connects a front surface probe 11 and the test head 23 is in parallel and opposite to a direction of a conduction path of the semiconductor wafer holding portion 6. For this reason, the direction of current flowing through the probe connecting portion 22a is opposed to the direction of the current flowing through the semiconductor wafer holding portion 6, allowing for a reduction in inductance.

In addition, the probe connecting portion 22a is sufficiently spaced from the semiconductor wafer holding portion 6, so that the insulation is secured even with the high current.

<Ninth Modification>

Figure 12:
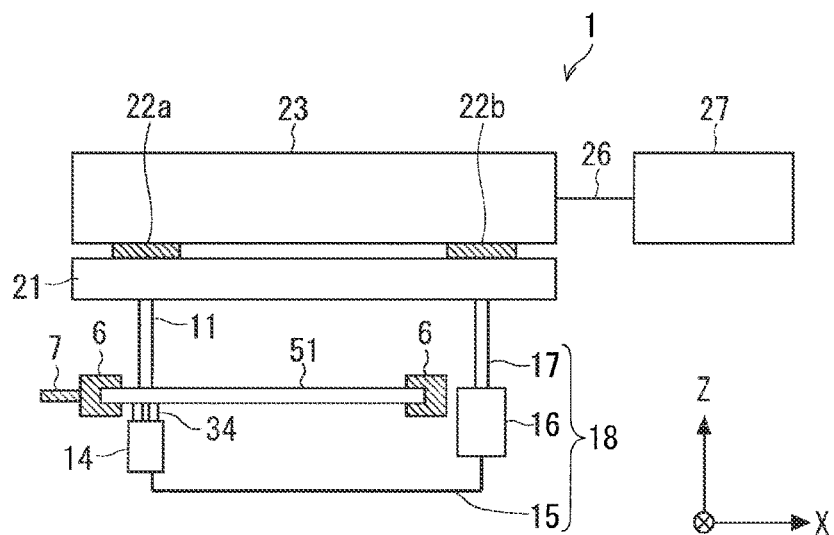
FIG. 12 is a cross-sectional view showing a schematic configuration of a semiconductor evaluation apparatus according to a ninth modification.

FIG. 12 is a cross-sectional view showing a schematic configuration of a semiconductor evaluation apparatus 1 according to a ninth modification. In the ninth modification, a back surface connecting portion is not any of an electrode portion 14a and a semiconductor wafer holding portion 6, and includes back surface probes 34. Even if the semiconductor evaluation apparatus 1 according to the ninth modification has such configuration, the semiconductor evaluation apparatus 1 can obtain effects similar to those in the first preferred embodiment.

Second Preferred Embodiment

Figure 13:
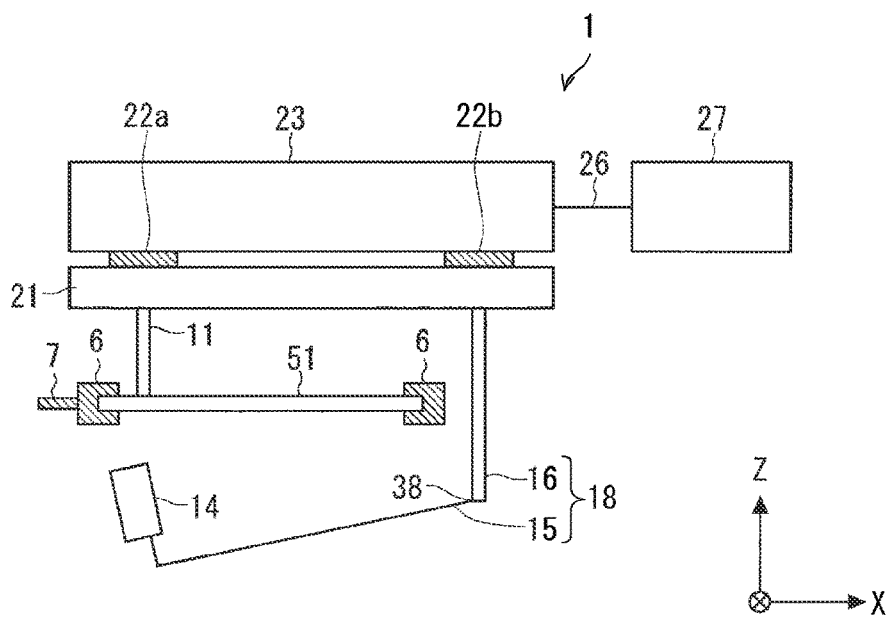
FIGS. 13 and 14 are cross-sectional views showing schematic configurations of a semiconductor evaluation apparatus according to a second preferred embodiment.
Figure 14:
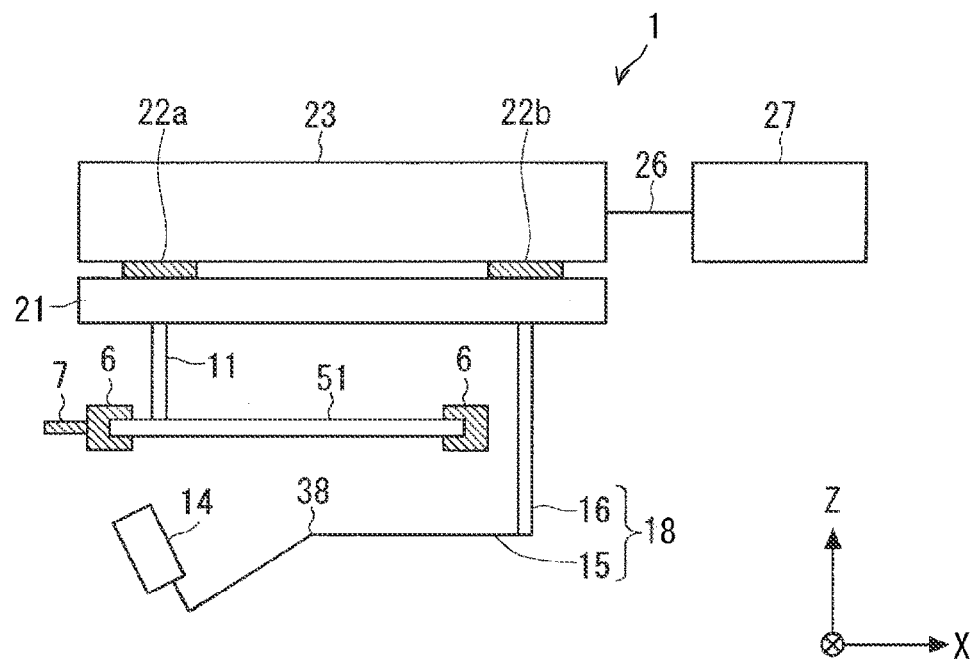

FIGS. 13 and 14 are cross-sectional views showing schematic configurations of a semiconductor evaluation apparatus 1 according to a second preferred embodiment of the present invention. FIG. 13 and FIG. 14 show different configurations from each other. In the semiconductor evaluation apparatus 1 according to the second preferred embodiment, the same components as or similar components to those described above are denoted by the same references, and differences will be mainly described.

In the second preferred embodiment, the extension electrode front surface probe 17 is omitted, and the extension electrode 16 extends to the probe substrate 21 along the Z direction and is electrically connected to the probe connecting portion 22b. In other words, the back surface potential lead-out portion 18 is formed of the wiring portion 15 and the extension electrode 16, and the wiring portion 15 serves as the one end portion of the back surface potential lead-out portion 18 while the extension electrode 16 serves as the other end portion of the back surface potential lead-out portion 18. The extension electrode 16 is configured to be attachable and detachable by fitting in a socket located in the probe substrate 21, but this is not restrictive.

In the second preferred embodiment, the back surface potential lead-out portion 18 includes a movable mechanism 38 capable of bringing the electrode portion 14a of the stage 14 close to and separating the electrode portion 14a from the front surface probe 11. In the configuration in FIG. 13, the back surface potential lead-out portion 18 includes the movable mechanism 38 at the connection portion between the wiring portion 15 and the extension electrode 16 while in the configuration in FIG. 14, the back surface potential lead-out portion 18 includes the movable mechanism 38 in the middle of the wiring portion 15. It is assumed that a joint equipped with a rotation mechanism is used for the movable mechanism 38, but this is not restrictive.

<Conclusion of Second Preferred Embodiment>

In the first preferred embodiment, the extension electrode front surface probe 17 and the extension electrode 16 are brought into contact with and separated from each other every time the semiconductor wafer 51 is moved. In contrast, in the semiconductor evaluation apparatus 1 according to the second preferred embodiment, the movable mechanism 38 is provided, and thus the stage 14 (electrode portion 14a) can be brought into contact with and be separated from the semiconductor wafer 51 without performing the contact and the separation in the above-mentioned manner. As a result, the continuity between the extension electrode front surface probe 17 and the extension electrode 16 does not need to be checked, making the steps easier. Furthermore, the generation of heat from the connection portion between the extension electrode front surface probe 17 and the extension electrode 16 can also be suppressed.

The configuration in FIG. 14 can reduce space for the movement of the stage 14 more than the configuration in FIG. 13, and thus the miniaturization of the semiconductor evaluation apparatus 1 is expected.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor evaluation apparatus that evaluates a plurality of vertical semiconductor devices provided in a semiconductor wafer, said vertical semiconductor devices each including a front surface electrode and a back surface electrode respectively provided on a front surface and a back surface of said semiconductor wafer, said semiconductor evaluation apparatus comprising:
   a semiconductor wafer holding portion that holds said semiconductor wafer;
   a front surface probe that is electrically connected to said front surface electrode in a case of being in contact with said front surface electrode on said semiconductor wafer held by said semiconductor wafer holding portion;
   a back surface connecting portion that is electrically connected to said back surface electrode in a case of being in contact with said back surface electrode on said semiconductor wafer held by said semiconductor wafer holding portion;
   a back surface potential lead-out portion that has one end portion disposed in a side of said back surface of said semiconductor wafer held by said semiconductor wafer holding portion and electrically connected to said back surface connecting portion and that has the other end portion disposed in a side of said front surface of said semiconductor wafer held by said semiconductor wafer holding portion and electrically connected to said one end portion; and an evaluation unit that passes current through said front surface electrode and said back surface electrode via said front surface probe and said other end portion of said back surface potential lead-out portion, respectively, to evaluate electrical characteristics of said vertical semiconductor devices, wherein said semiconductor wafer and said semiconductor wafer holding portion that holds said semiconductor wafer, or said front surface probe, said back surface connecting portion, and said back surface potential lead-out portion are movable in an in-plane direction of said semiconductor wafer, and in a case where said semiconductor wafer and said semiconductor wafer holding portion that holds said semiconductor wafer, or said front surface probe, said back surface connecting portion, and said back surface potential lead-out portion are moved in said in-plane direction, one of said semiconductor wafer and a portion of said back surface potential lead-out portion located in said in-plane direction from said semiconductor wafer is fixed close to the outside of a movement region of the other.

2. The semiconductor evaluation apparatus according to claim 1, wherein said back surface potential lead-out portion includes a movable mechanism capable of bringing said back surface connecting portion close to and separating said back surface connecting portion from said front surface probe.

3. The semiconductor evaluation apparatus according to claim 1, wherein said semiconductor wafer holding portion is in contact with a peripheral portion of said semiconductor wafer to hold said semiconductor wafer.

4. The semiconductor evaluation apparatus according to claim 1, wherein said semiconductor wafer holding portion is capable of rotating said semiconductor wafer 180 degrees in a plan view of the semiconductor wafer.

5. The semiconductor evaluation apparatus according to claim 1, wherein said back surface connecting portion includes a back surface probe, or includes an electrode portion provided on a stage of said semiconductor wafer, or is formed of said semiconductor wafer holding portion that is in contact with said back surface of said semiconductor wafer so as to be electrically connectable to said back surface of said semiconductor wafer.

6. The semiconductor evaluation apparatus according to claim 5, wherein said back surface connecting portion includes a plurality of said electrode portions provided on said stage, and
said plurality of electrode portions are capable of being simultaneously in contact with two or more of said vertical semiconductor devices.

7. The semiconductor evaluation apparatus according to claim 5, wherein said back surface connecting portion includes said electrode portion provided on said stage, and
said electrode portion is replaceable with another electrode portion.

8. The semiconductor evaluation apparatus according to claim 5, wherein said back surface connecting portion includes said electrode portion provided on said stage,
said electrode portion includes a sense electrode and a force electrode, and
said sense electrode and said force electrode are capable of being simultaneously in contact with said back surface electrode of said vertical semiconductor devices, said back surface electrode corresponding to said sense electrode and said force electrode.

9. The semiconductor evaluation apparatus according to claim 5 further comprising a test head that is electrically connected to said front surface probe, wherein said back surface connecting portion is formed of said semiconductor wafer holding portion that is in contact with said back surface of said semiconductor wafer so as to be electrically connectable to said back surface of said semiconductor wafer, and
a direction of a conduction path of a member that electrically connects said front surface probe and said test head is in parallel to a direction of a conduction path of said semiconductor wafer holding portion.

10. The semiconductor evaluation apparatus according to claim 1, wherein said back surface potential lead-out portion includes:
an extension electrode that is electrically connected to said one end portion; and
an extension electrode front surface probe that serves as said other end portion, and
said extension electrode and said extension electrode front surface probe are capable of being in contact with and separated from each other.

11. The semiconductor evaluation apparatus according to claim 10, wherein said back surface potential lead-out portion further includes a metal plate or a cable that serves as said one end portion and that electrically connects said back surface connecting portion and said extension electrode.

12. The semiconductor evaluation apparatus according to claim 10, further comprising:

an insulating substrate that fixes said front surface probe and said extension electrode front surface probe; and
a test head that is electrically connected to said evaluation unit and, in a case where said insulating substrate is attached to the test head, is electrically connected to said front surface probe and said extension electrode front surface probe,
wherein by replacing said insulating substrate with another insulating substrate, said front surface probe and said extension electrode front surface probe are also replaceable with another front surface probe and another extension electrode front surface probe, respectively.

13. The semiconductor evaluation apparatus according to claim 10, further comprising:

a first insulating substrate that fixes said front surface probe;
a second insulating substrate that fixes said extension electrode front surface probe; and
a test head that is electrically connected to said evaluation unit, and, in a case where said first insulating substrate is attached to the test head, is electrically connected to said front surface probe and, in a case where said second insulating substrate is attached to the test head, is electrically connected to said extension electrode front surface probe, wherein by replacing said first insulating substrate with another first insulating substrate, said front surface probe is also replaceable with another front surface probe.

14. The semiconductor evaluation apparatus according to claim 10, wherein said extension electrode front surface probe includes a spring probe having a built-in spring.

15. A semiconductor evaluation method for evaluating a plurality of vertical semiconductor devices provided in a semiconductor wafer, said vertical semiconductor devices each including a front surface electrode and a back surface electrode respectively provided on a front surface and a back surface of said semiconductor wafer, said semiconductor evaluation method comprising the steps of:

(a) holding said semiconductor wafer by a semiconductor wafer holding portion;

(b) bringing a front surface probe into contact with said front surface electrode on said semiconductor wafer held by said semiconductor wafer holding portion to electrically connect said front surface probe and said front surface electrode;

(c) bringing a back surface connecting portion into contact with said back surface electrode on said semiconductor wafer held by said semiconductor wafer holding portion to electrically connect said back surface connecting portion and said back surface electrode;

(d) disposing one end portion of a back surface potential lead-out portion in a side of said back surface of said semiconductor wafer held by said semiconductor wafer holding portion and disposing the other end portion in a side of said front surface of said semiconductor wafer held by said semiconductor wafer holding portion, said one end portion being electrically connected to said back surface connecting portion, said other end portion being electrically connected to said one end portion of said back surface potential lead-out portion; and (e) passing current through said front surface electrode and said back surface electrode via said front surface probe and said other end portion of said back surface potential lead-out portion, respectively, to evaluate electrical characteristics of said vertical semiconductor devices, wherein said semiconductor wafer and said semiconductor wafer holding portion that holds said semiconductor wafer, or said front surface probe, said back surface connecting portion, and said back surface potential lead-out portion are movable in an in-plane direction of said semiconductor wafer, and in a case where said semiconductor wafer and said semiconductor wafer holding portion that holds said semiconductor wafer, or said front surface probe, said back surface connecting portion, and said back surface potential lead-out portion are moved in said in-plane direction, one of said semiconductor wafer and a portion of said back surface potential lead-out portion located in said in-plane direction from said semiconductor wafer is fixed close to the outside of a movement region of the other.

* * * * *